United States Patent
Abraham et al.

(10) Patent No.: US 9,344,092 B2
(45) Date of Patent: May 17, 2016

(54) TUNABLE SUPERCONDUCTING NOTCH FILTER

(71) Applicant: International Business Machines Corporation, Armonk, NY (US)

(72) Inventors: David W. Abraham, Croton, NY (US); Jerry M. Chow, Yorktown Heights, NY (US); Jay M. Gambetta, Yorktown Heights, NY (US); Nicholas A. Masluk, Yorktown Heights, NY (US); Matthias Steffen, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 128 days.

(21) Appl. No.: 14/453,718

(22) Filed: Aug. 7, 2014

(65) Prior Publication Data
US 2016/0112031 A1    Apr. 21, 2016

(51) Int. Cl.
| | |
|---|---|
| *H03K 19/195* | (2006.01) |
| *H01L 39/02* | (2006.01) |
| *H01L 27/00* | (2006.01) |
| *H01B 12/00* | (2006.01) |

(Continued)

(52) U.S. Cl.
CPC ............ *H03K 19/1954* (2013.01); *H03K 17/92* (2013.01)

(58) Field of Classification Search
CPC .................. H01L 39/223; H01L 2924/30105; H01L 2924/30107; H03H 7/0115; H03H 1/00; H03H 2001/005; H03H 2001/0057; H03H 2001/0092; H03H 3/00; H03B 19/00; H03B 2200/0084; H03B 5/1212; H03B 5/1228; H03B 5/1243; H03B 5/1852
USPC ...................................... 257/30–40
See application file for complete search history.

(56) References Cited

U.S. PATENT DOCUMENTS

| | | | | |
|---|---|---|---|---|
| 4,496,854 | A * | 1/1985 | Chi ..................... | G01R 33/0354 257/34 |
| 4,626,701 | A * | 12/1986 | Harada ................... | H02M 7/04 327/367 |
| 6,347,237 | B1 | 2/2002 | Eden et al. | |

(Continued)

OTHER PUBLICATIONS

List of IBM Patents or Patent Applications Treated as Related; Aug. 7, 2014; pp. 1-2.

(Continued)

*Primary Examiner* — Howard Weiss
*Assistant Examiner* — Nelson Garces
(74) *Attorney, Agent, or Firm* — Cantor Colburn LLP; Vazken Alexanian

(57) ABSTRACT

A technique relates to a superconductor tunable notch filter. A Josephson junction filter array is connected to a coupling pad and connected to ground. The Josephson junction filter array includes a filter inductance. The Josephson junction filter array connected to the coupling pad forms a filter capacitance. A Josephson junction bias array is connected to the coupling pad and connected to a current source. The Josephson junction bias array includes a bias inductance. A transmission line is connected to the coupling pad in which connection of the transmission line and the coupling pad forms a coupling capacitance, such that the filter inductance and the filter capacitance connect to the transmission line through the coupling capacitance. The Josephson junction filter array includes a notch filter frequency that is tunable according to a magnitude of a current bias from the current source.

20 Claims, 14 Drawing Sheets

(51) Int. Cl.
   *H01L 29/06*   (2006.01)
   *H03K 17/92*   (2006.01)

(56) References Cited

U.S. PATENT DOCUMENTS

| | | | |
|---|---|---|---|
| 7,253,654 B2 | 8/2007 | Amin | |
| 7,601,946 B2 | 10/2009 | Powers et al. | |
| 8,143,896 B2* | 3/2012 | McDowell | G01N 24/088 324/318 |
| 8,441,329 B2 | 5/2013 | Thom et al. | |
| 8,536,566 B2 | 9/2013 | Johansson et al. | |
| 2003/0207766 A1* | 11/2003 | Esteve | B82Y 10/00 505/190 |
| 2004/0077503 A1* | 4/2004 | Blais | B82Y 10/00 505/190 |
| 2005/0001209 A1* | 1/2005 | Hilton | B82Y 10/00 257/20 |
| 2009/0192041 A1* | 7/2009 | Johansson | G06N 99/002 505/170 |
| 2011/0152104 A1* | 6/2011 | Farinelli | B82Y 10/00 505/210 |
| 2014/0167836 A1* | 6/2014 | Gambetta | H03K 19/195 327/528 |

OTHER PUBLICATIONS

J. Gambetta et al., "Quantum circuit within waveguide-beyond-cutoff," U.S. Appl. No. 13/056,987, filed Dec. 13, 2012.

P. Jones et al., "Highly controllable qubit-bath coupling based on a sequence of resonators," Journal of Low Temperature Physics, vol. 173, No. 3-4, 2013, pp. 152-169.

R. Rafique et al., "Niobium Tunable Microwave Filter." IEEE Transactions on Microwave Theory and Techniques, vol. 57, No. 5, 2009, pp. 1173-1179.

M. Reed, et al., "Fast Reset and Suppressing Spontaneous Emission of a Superconducting Qubit," Applied Physics Letters, vol. 96, No. 20, 2010, 203110; 3 pages.

S. Srinivasan et al., "Tunable coupling in circuit quantum electrodynamics using a superconducting charge qubit with a V-shaped energy level diagram," Physical Review Letters, vol. 106, No. 8, 2011, 083601, 4 pages.

Y. Yin et al., "Catch and release of microwave photon states," Physical Review Letters, vol. 110, No. 10, 2013, 107001, 5 pages.

J. Gambetta et al., "Quantum circuit within waveguide-beyond-cutoff," U.S. Appl. No. 13/969,780, filed Aug. 19, 2013.

* cited by examiner

TUNABLE SUPERCONDUCTING NOTCH FILTER

STATEMENT REGARDING FEDERALLY SPONSORED RESEARCH OR DEVELOPMENT

This invention was made with Government support under W911NF-10-1-0324 awarded by Army Research Office (ARO). The Government has certain rights to this invention.

BACKGROUND

The present invention relates to superconducting quantum circuits, and more specifically, to a superconducting tunable notch filter connected to a superconducting quantum circuit.

Superconducting quantum computing is a promising implementation of quantum information technology that involves nano fabricated superconducting circuits, using Josephson junctions as non-linear elements.

For an integrated circuit to behave quantum mechanically, the first requirement is the absence (or reduction) of dissipation. More specifically, all metallic parts need to be made out of a material that has zero resistance at the qubit operating temperature and at the qubit transition frequency. This is essential in order for electronic signals to be carried from one part of the chip to another without energy loss which is a condition for the preservation of quantum coherence. Low temperature superconducting materials are utilized for this task, and accordingly quantum integrated circuit implementations are referred to as superconducting qubits.

SUMMARY

According to one embodiment, a superconductor tunable notch filter is provided. A Josephson junction filter array is connected to a coupling pad and connected to ground, and the Josephson junction filter array comprises a filter inductance. The Josephson junction filter array connected to the coupling pad forms a filter capacitance. A Josephson junction bias array is connected to the coupling pad and connected to a current source, and the Josephson junction bias array comprises a bias inductance. A transmission line is connected to the coupling pad in which connection of the transmission line and the coupling pad forms a coupling capacitance, such that the filter inductance and the filter capacitance connect to the transmission line through the coupling capacitance. The Josephson junction filter array comprises a notch filter frequency that is tunable according to a magnitude of a current bias from the current source.

According to one embodiment, a method for providing a superconductor tunable notch filter. The method includes configuring a Josephson junction filter array connected to a coupling pad and connected to ground. The Josephson junction filter array comprises a filter inductance ($L_f$). The Josephson junction filter array connected to the coupling pad forms a filter capacitance ($C_f$). The method includes configuring a Josephson junction bias array connected to the coupling pad and connected to a current source, where the Josephson junction bias array comprises a bias inductance ($L_{bias}$), and configuring a transmission line connected to the coupling pad in which connection of the transmission line and the coupling pad form a coupling capacitance, such that the filter inductance and the filter capacitance connect to the transmission line through the coupling capacitance. The Josephson junction filter array comprises a notch filter frequency that is tunable according to a magnitude of a current bias from the current source.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
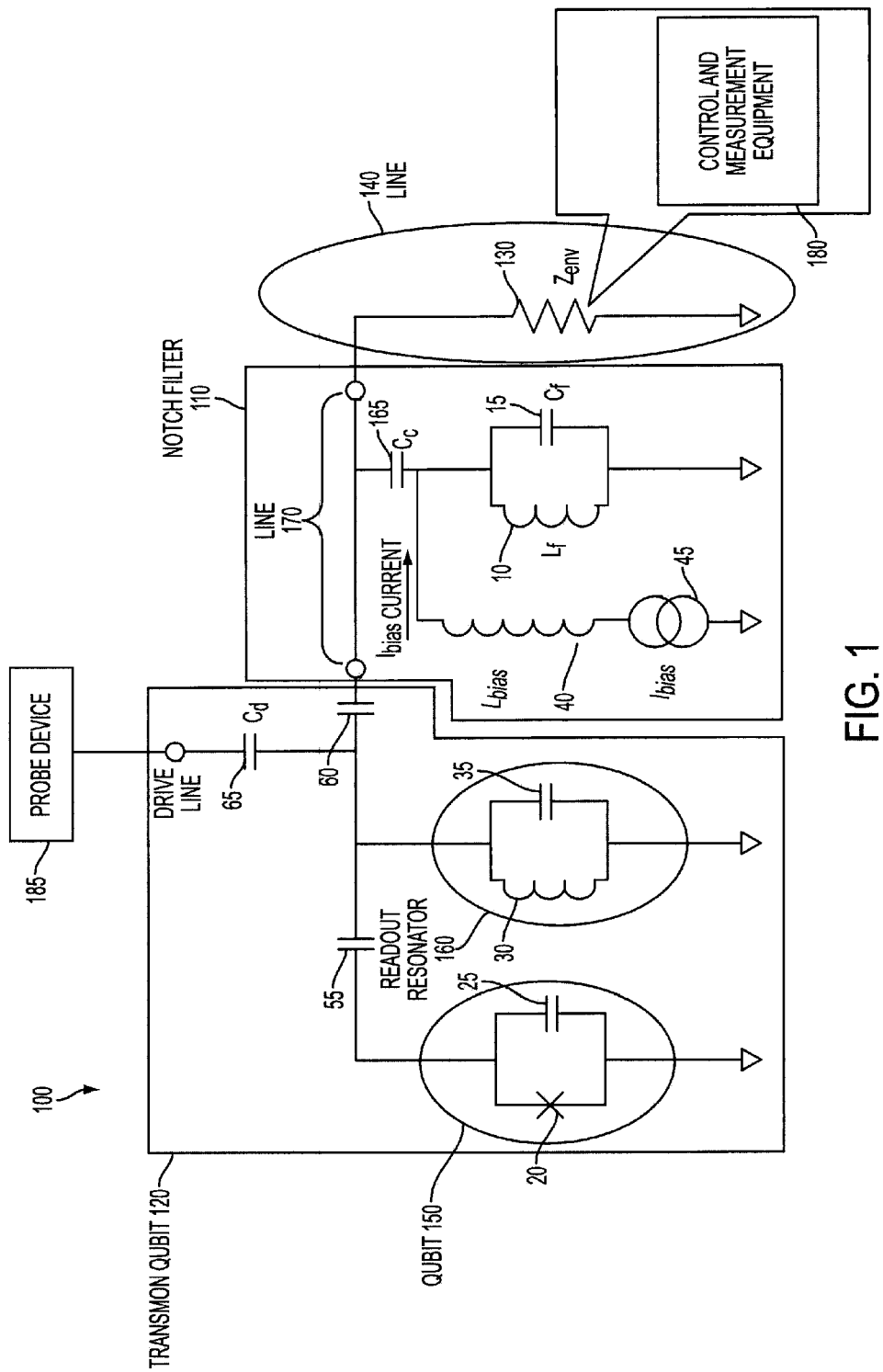
FIG. 1 illustrates a schematic of a superconducting tunable notch filter connected between a superconducting qubit circuit and a dissipative readout and measurement line according to an embodiment.

Embodiments provide a superconducting tunable notch filter. Benefits of the notch filter presented herein, over typical microwave filters, include very low loss due to the use of superconducting materials, while having the ability to tune via the use of Josephson junctions as inductive elements. For example, the inductors made using Josephson junctions have quality factors exceeding 10,000 (Q>10,000). In addition, the notch filter is constructed using the same fabrication techniques as superconducting qubits, so the superconducting notch filter may be implemented on-chip with existing qubit architectures without any modification to standard fabrication procedures, which is advantageous for scaling.

Superconducting qubits which couple to a microwave resonator for readout may lose energy through the resonator, as the resonator is generally strongly coupled to a dissipative environment (which is part of the control and measurement electronics (all of which is referred to as Z environment)). The relaxation time $T_1$ is limited by the real part of the admittance shunting the qubit at the qubit frequency, in the case of the transmon given by:

$$T_1 = C_\Sigma/(Re[Y(\omega_{ge})]), \quad \text{Eq. (1)}$$

where $C_\Sigma$ is the total shunt capacitance across the qubit junction, and $Y(\omega)$ is the total admittance across the qubit junction, and $\omega_{ge}$ is the transition frequency of the qubit. The readout resonator acts as a filter between the qubit and dissipative measurement and control environment. When the qubit frequency is close to the readout resonator frequency, coupling of the qubit to the lossy environment is enhanced, reducing the energy relaxation time for the qubit. This enhancement of relaxation rate is known as the Purcell effect.

By detuning the qubit frequency from the readout frequency, relaxation due to the Purcell effect is reduced (the Purcell effect scales as $1/\Delta^2$, where $\Delta$ is the qubit-readout detuning). However, coupling between the qubit and readout resonator reduces (scaling as $1/\Delta$) fidelity of the readout. The Purcell effect may also be reduced by increasing the quality factor Q of the readout resonator, but this reduces the speed at which qubit measurements may be taken.

In order to maintain fast and high-fidelity readout while reducing Purcell-enhanced relaxation of the qubit, a notch filter at the qubit frequency may be placed between the readout resonator and dissipative control/measurement transmission lines. Any photons at the qubit frequency which leak out of the readout resonator will, to a large extent, bounce off the notch filter and return to the qubit, rather than dissipate in the control/measurement lines. This is done at no cost to readout fidelity, as photons at the readout frequency pass through the filter unimpeded.

Two state-of-the-art techniques are utilized to reduce the Purcell effect but the state-of-the-art techniques lack the flexibility of the superconducting tunable notch filter presented herein according to embodiments.

For the first state-of-the-art technique, this paper uses quarter-wavelength transmission line stubs to implement a notch filter at the qubit frequency. A transmission line stub is a length of transmission line or waveguide that is connected at one end only, and the free end of the stub is left as an open circuit. In order to gain the maximum benefit from this filter, the qubit frequency must be matched to the filter pole. This matching becomes more critical as other losses to $T_1$ continue to improve (as the Purcell loss will become the limiting factor to $T_1$), necessitating a tunable qubit which is prone to reduced coherence times, or fabrication precision which is well beyond present capabilities. The transmission line stubs as implemented in the above reference also result in a fairly broad modification of the external transmission line, while the superconducting tunable filter presented herein (according to embodiments) has a minimal affect outside the filtered frequency.

For the second state-of-the-art technique, another method of filtering uses waveguides to couple between the qubit's readout resonator and the control/measurement electronics. Waveguides are chosen such that the cutoff frequency lies between the qubit and readout frequency, so the qubit is only weakly coupled to Purcell loss through evanescent waves which decay exponentially with waveguide length. The issue with this method is that it requires relatively large and bulky waveguides, and only works in the case where the qubit frequency is below the readout frequency.

Embodiments present a tunable superconducting microwave notch filter. The notch filter consists of a high quality factor lumped-element resonator, capacitively coupled to a microwave transmission line. Insertion of this notch filter is minimally invasive, and does not degrade qubit readout performance. The notch filter inductance is formed by a Josephson junction array, which may be tuned by applying a DC bias current. DC bias is applied through another array of Josephson junctions, which acts as a high impedance at microwave frequencies. The use of superconducting materials allows the filter to have very high rejection at the filter pole, due to low internal dissipation.

Now turning to the figures, FIG. 1 illustrates a circuit schematic 100 of the superconducting tunable notch filter 110, shown connected between a superconducting transmon qubit circuit 120 and a dissipative readout and measurement line 140 according to an embodiment.

The superconducting tunable notch filter 110 is a tunable two-pole filter, consisting of an LC oscillator capacitively coupled to the microwave transmission line 140. The LC oscillator is an inductor/Josephson junction filter array 10 and capacitor 15. The notch filter 110 is inserted between the qubit circuit 120 and control and measurement transmission line 140 of characteristic impedance $Z_{env}$ (Z environment). The $Z_{env}$ 130 represents the impedance of the control/measurement transmission line 140. The $Z_{env}$ 130 includes control and measurement equipment 180 configured to transmit and measure signals (including microwave signatures) as understood by one skilled in the art. It is understood that the control and measurement equipment has the characteristic impedance of $Z_{env}$ 130. The transmon qubit circuit 120 includes the transmon qubit 150 and its readout resonator 160. The transmon qubit 150 includes a Josephson junction device 20 connected in parallel with a capacitor 25. The readout resonator 160 includes an inductor/Josephson junction device 30 and capacitor 35 connected in parallel (or a CPW (coplanar waveguide) or cps (coplanar stripline) resonator. A capacitor 55 is connected between the readout resonator 160 and the qubit 150. Note that although the superconducting qubit circuit 120 is described as transmon qubit circuit for explanation purposes, it is understood that the superconducting qubit circuit 120 is not meant to be limited and applies to super conducting qubits circuits that are not transmon circuits.

The notch filter 110 should be placed close to the superconducting qubit circuit 120 such as, e.g., within a wavelength of the qubit frequency. As an example, for a qubit frequency of 5 GHz on silicon or sapphire, the wavelength is about c/5 GHz/sqrt(11) which is approximately (~) 1.8 cm. Accordingly, the notch filter 110 should only be a few millimeters away. The filter inductance $L_f$ of inductor/Josephson junction filter array 10 and capacitance $C_f$ of capacitor 15 are capacitively coupled (via capacitor $C_c$ 165) to the microwave transmission line 140 via capacitance $C_c$ 165.

The inductance $L_f$ of the notch filter 110 is formed by an array of Josephson junctions 10 (connected in series). The nonlinearity of the Josephson junctions with respect to current allows for the filter inductance $L_f$ of the Josephson junction filter array 10 to be tuned with the application of a bias current $I_{bias}$, thereby tuning the poles of the notch filter 110. The filter inductance $L_f$ of the Josephson junction filter array 10 is given by:

$$L_f(I) = \frac{N\phi_0/I_C}{\sqrt{1-(I/I_C)^2}}, \qquad \text{Eq. (2)}$$

where I is the bias current ($I_{bias}$), N is the number of junctions in the array 10, $\phi_0 = h/(2e)$ is the reduced flux quantum, and $I_C$ is the critical current of the junctions.

In order to apply the current bias ($I_{bias}$) to the array 10, a high impedance current source 45 is required. To ensure the current source 45 is high impedance at microwave frequencies (i.e., frequencies in the microwave range in the electromagnetic spectrum), a Josephson junction bias array 40, of higher inductance $L_{bias}$, is used.

An additional weakly coupled drive port (drive line) is added to the transmon qubit circuit 120 in order to bypass the notch filter 110 and allow the transmon qubit circuit 120 to be controlled. The drive line coupling capacitance $C_d$ (via capacitor 65) is chosen to be small enough that the capacitance $C_d$ is not the limiting factor to $T_1$, and merely requires that a voltage signal can be delivered to the qubit circuit 120 to drive quantum gates.

Figure 2A:
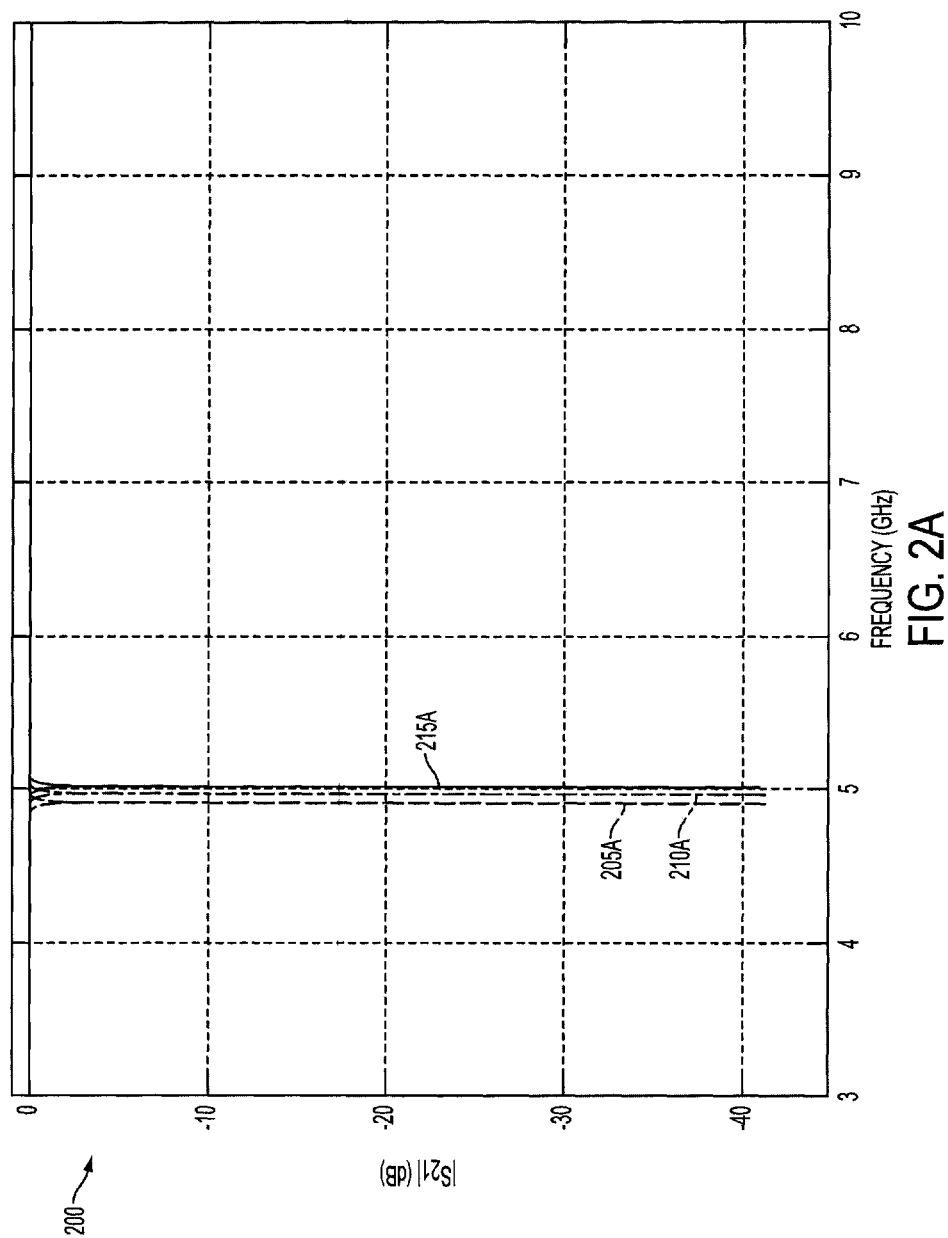
FIG. 2A illustrates a graph of an example transmission response of the notch filter tuned to example frequencies according to an embodiment.
Figure 2B:
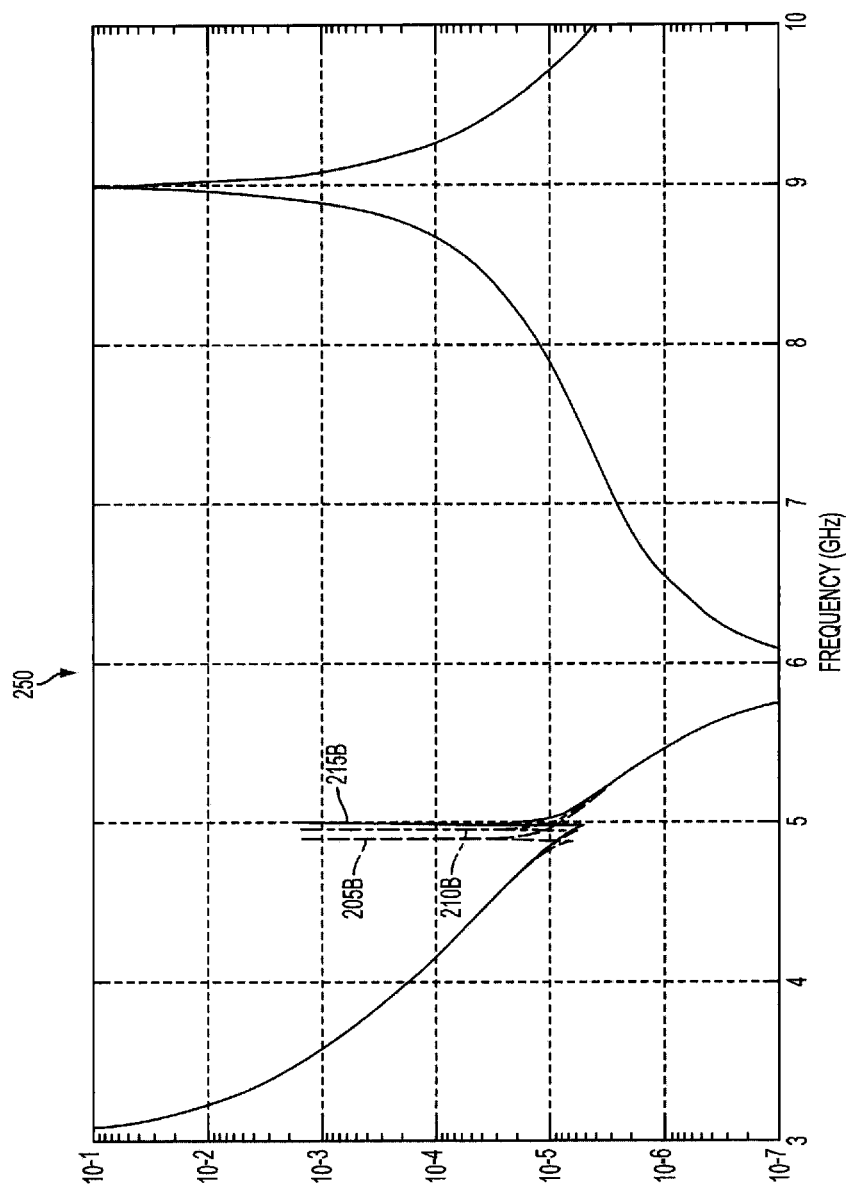
FIG. 2B illustrates a graph of improved $T_1$ improvement for the superconducting qubit circuit according to an embodiment.

Example filter response and $T_1$ improvement are respectively illustrated in FIGS. 2A and 2B. According to embodiments, FIG. 2A illustrates a graph 200 of an example transmission response of the notch filter 110 tuned to notch filter frequency 4.88 GHz (waveform 205A), tuned to notch filter frequency 4.95 GHz (waveform 210A), and tuned to notch filter frequency 5 GHz (waveform 215A). As can be seen, the tunable notch filter 110 blocks frequencies at each particular notch filter frequency it is tuned to. Note that the notch filter 110 is measured by itself (via control and measurement equipment 180) and not with the qubit circuit 120.

The notch filter 110 can be tuned down to a lower notch filter frequency by applying a DC bias current ($I_{bias}$) to the notch filter 110. As shown by waveform 215A, the notch filter 110 may be configured to have a natural band stop (block frequencies) at 5 GHz, such as when no $I_{bias}$ current is applied by the current source 45. Assuming that he qubit frequency of the qubit 150 is at 5 GHz, the qubit frequency (e.g., at 5 GHz) is reflected back to the qubit 150 when the notch filter 110 is tuned to notch filter frequency 5 GHz (naturally in this case without requiring a DC bias). This reflection at the qubit frequency improves the $T_1$ relaxation time, where the $T_1$ time measures how long the qubit 150 remains in the excited state. The notch filter 110 reflects the signal back to the qubit 150 at its qubit frequency and reduces the Purcell effect such that the qubit 150 remains in the excited state for a longer length of time before losing energy and moving to the ground state.

As shown by waveform 210A, the notch filter 110 can be tuned down to notch filter frequency 4.95 GHz (i.e., block frequencies at 4.95 GHz from the transmon qubit circuit 120) by applying a biasing current ($I_{bias}$) of 0.2 value is $0.2*I_C$, where $I_C$ is the critical current of the junctions in array $L_f$ (labeled 10). Similarly, when the qubit frequency of the qubit 150 is at 4.95 GHz, the qubit frequency (e.g., at 4.95 GHz) is reflected back to the qubit 150 when the notch filter 110 is tuned down to notch filter frequency 4.95 GHz by applying the DC bias current ($I_{bias}$) via the current source 45.

As shown by waveform 205A, the notch filter 110 can be tuned down to notch filter frequency 4.88 GHz (i.e., block frequencies at 4.88 GHz from the transmon qubit circuit 120) by applying a biasing current ($I_{bias}$) of $0.3*I_C$. Similarly, when the qubit frequency of the qubit 150 is at 4.88 GHZ, the qubit frequency (e.g., at 4.88 GHz) is reflected back to the qubit 150 when the notch filter 110 is tuned down to notch filter frequency 4.88 GHz by applying the DC bias current ($I_{bias}$) via the current source 45.

Referring to FIGS. 2A and 2B, for evaluating the transmission response of the transmon qubit circuit 120 connected to the notch filter 110 in circuit 100, the notch filter 110 has a $C_c$=13.946 fF (femtofarad) for capacitor 165, $C_f$=35.914 fF for capacitor 15, $L_f$=21.42 nH (nanohenry) for inductor/Josephson junction filter array 10, and $L_{bias}$=200 nH for inductor/Josephson junction bias array 40. The characteristic impedance of the Z environment (for $Z_{env}$ 130) is 50 Ω (ohms) as understood by one skilled in the art. It is understood that the control and measurement equipment 180 is part of the Z environment.

According to an embodiment, FIG. 2B illustrates a graph 250 of $T_1$ improvement (i.e., spike) when reading out the transmon qubit circuit 120 (particularly the qubit 150) by the Z environment ($Z_{env}$ 130). Note that in FIG. 2B the control and measurement equipment 180 reads (measures) the signals. This particular plot in graph 250 demonstrates improved T1 for a transmon qubit, and it is understood that other qubits (e.g., that are not transmon) would have a similar improvement. FIG. 2B shows the graph 250, bound on $T_1$ time due to the Purcell effect, with improvement at 5 GHz (waveform 215B), improvement at 4.95 GHz (waveform 210B), and improvement at 4.88 GHz (waveform 205A) according to the matching the notch filter frequency of the notch filter 110 to the particular qubit frequency. It may be assumed that transmon qubit circuit 120 has a qubit capacitance of 60 fF for capacitor 25, and the qubit 150 is coupled to a 6 GHz quarter wavelength resonator (which means the readout frequency of the readout resonator 160 is 6 GHz. The $Z_{env}$ 130 has a 50Ω characteristic impedance via a 10 fF coupling capacitor 60. In this model, a 20 mm segment of transmission line (with phase velocity 1.1×108 m/s) is placed between the transmon qubit 120 and the notch filter 110. As can be seen at each tuned notch filter frequency (5 GHz, 4.95 GHz, 4.88 GHz) of the notch filter 110, more than an order of magnitude in $T_1$ improvement exists where the filter is tuned. That is, the energy at each notch filter frequency of the notch filter 110 increases at the example qubit frequency of the transmon qubit 120, because for each example case, the energy is reflected back to the transmon qubit 120 at the particular qubit frequency allowing the transmon qubit circuit 120 to stay in the excited state for a longer period of time. It is assumed that the qubit frequency is 5 GHz in one case, 4.95 GHz in one case, and 4.88 GHz in another case, and the notch filter frequency of notch filter 110 is respectively tuned to block and reflect each qubit frequency (for each case 5 GHz, 4.95 GHz, 4.88 GHz) back to the transmon qubit 120. This reflection/block by the notch filter 110 provides $T_1$ time improvement at the qubit frequency.

As understood by one skilled in the art, it may be difficult to manufacture the qubit 150 with an exact qubit frequency, and the qubit frequency may be within a predefined tolerance. Embodiments are designed such that the maximum qubit frequency of the qubit 150 in the transmon qubit 120 is below the natural frequency blocked (band stop) by the notch filter 110 when no DC bias current ($I_{bias}$) is applied by the current source 45. The superconducting notch filter 110 is tuned by applying the DC bias current ($I_{bias}$) as discussed herein. The notch filter 110 is at its highest (blocking) notch filter frequency when no DC bias current is applied. The tuning of the blocking notch filter frequency of the notch filter 110 may range from being tuned between a few megahertz (e.g., 1, 2, 3, 4, 5 MHz . . . etc.) to maybe ten megahertz (10 MHz).

Figure 3:
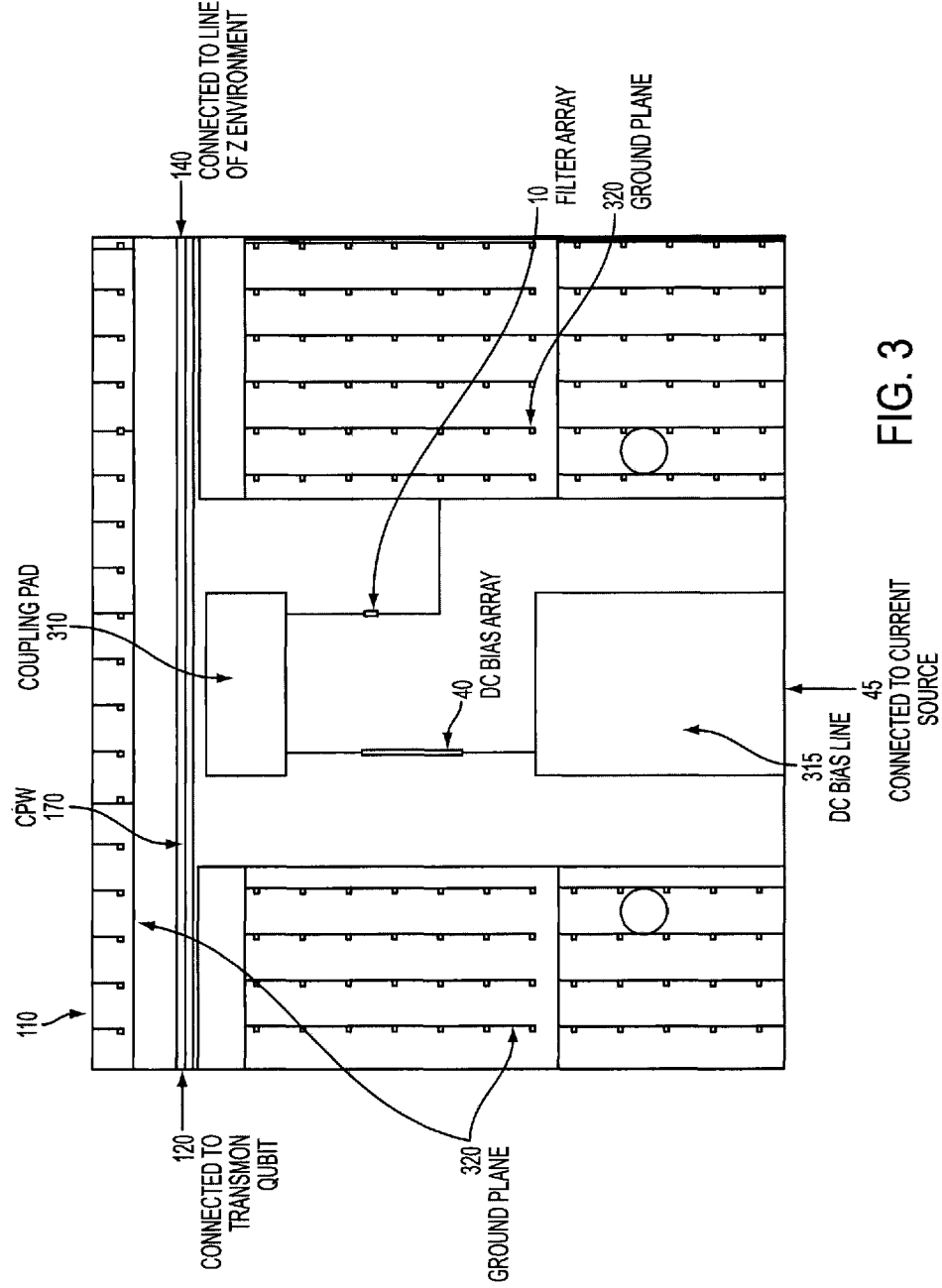
FIG. 3 illustrates a schematic of an implementation of the superconducting tunable notch filter according to an embodiment.

Now turning to FIG. 3, there is shown a schematic of a physical implementation of the superconducting tunable notch filter 110 according to an embodiment. More specifically, FIG. 3 is a computer aided design (CAD) drawing of the superconductor tunable notch filter for e-beam lithography. Note that the transmon qubit 120 and the line 140 (including $Z_{env}$ 130) are not shown, although transmon qubit circuit 120 and the line 140 are understood to be operatively connected to the notch filter 110 as shown in FIG. 1.

The transmission line 170 is implemented as a coplanar waveguide (CPW) 170, to which a metallic pad (coupling pad 310) is capacitively coupled to as capacitance $C_c$ (shown as capacitor 165 in FIG. 1). Note that the capacitor 165 represents the capacitance (connection) between the coupling pad 310 and the coplanar waveguide 170. The capacitance of this coupling pad 310 to ground 320 forms the filter capacitance $C_f$ (shown as capacitor 15 in FIG. 1). As represented by Josephson junction filter array/inductor 10, an array aluminum-aluminum oxide-aluminum Josephson junctions between the coupling pad 310 and ground 320 form inductance $L_f$ (of Josephson junction filter array 10). A longer array of Josephson junctions also connecting to the coupling pad 310 forms inductance $L_{bias}$ (shown as Josephson junction bias array/inductor 40 in FIG. 1). The long array of Josephson junctions 40 has more Josephson junctions than the array of Josephson junctions 10. The Josephson junction bias array 40 may also be referred to as the DC bias array. A DC bias line 315 connects to the other end of the Josephson junction array 40 to provide the $I_{bias}$ current that tunes the notch filter 110.

The entire superconducting tunable notch filter 110 is made of superconducting materials. The Josephson junction filter array 10 and the Josephson junction bias array 40 are made of aluminum and aluminum oxide. The array of Josephson junctions in both arrays 10 and 40 are connected in series. One skilled in the art understands how to construct a Josephson junction array. The coupling pad 310, the CPW/line 170, DC bias line 315 (connected to the current source 45), and the ground plane 320 may be made of titanium nitride, niobium, and/or aluminum, etc.

An example mode of operation is now discussed for the circuit 100 according to an embodiment. The first operation when a new qubit circuit 120 and notch filter 110 are being measured is to locate the readout resonator frequency (of the readout resonator 160) with a control and network equipment 180.

The readout resonator 160 is a resonator used to infer the state of the qubit 150; inferring the state of the qubit 150 means determining if the qubit 150 is in the excited state or ground state. When the readout resonator frequency is known (i.e., measured by the control and network equipment 180), the readout resonator frequency of the readout resonator 160 can be used to find the qubit frequency of the qubit 150 by having a network probe device 185 sweep an auxiliary RF signal in frequency via the drive line. When the auxiliary RF signal matches the qubit frequency of the qubit 150 (as measured and determined by the control and network equipment 180, the qubit 150 then transitions to the excited state (i.e., the qubit is energized).

Next, the notch filter frequency of the tunable notch filter 110, with no bias current ($I_{bias}$) applied, is found with the control and network equipment 180. A bias current ($I_{bias}$) is then applied via the current source 45 and increased in magnitude until the notch filter frequency of the notch filter 110 matches the qubit frequency of the qubit 150 in the transmon qubit circuit 120. The bias current ($I_{bias}$) can further decrease the notch filter frequency, by further increasing the magnitude of the bias current. To verify that the notch filter 110 is operating as desired, the $T_1$ time of the qubit 150 is measured (via the control and measurement equipment 180) with the notch filter 110 tuned on resonance with the qubit 150 (i.e., the notch filter frequency matches the qubit frequency and thus blocks/reflects the qubit frequency from escaping to the $Z_{env}$ 130) and then turned off resonance with the qubit 150 (i.e., the notch filter frequency does not match the qubit frequency, thus allowing energy at the qubit frequency to dissipate in the $Z_{env}$ 130). The control and measurement equipment 180 may include a data acquisition card. The data acquisition card analyzes time segments of the phase after excitation, and readout pulses are applied to the device. The $T_1$ time measures how long, on average, the qubit 150 is able to remain in the excited state before the qubit 150 loses energy and drops to the ground state. When the notch filter 110 is properly tuned on resonance with the qubit 150 (as discussed herein), the $T_1$ time is at a maximum. The notch filter 110 does not affect the performance of the readout of the readout resonator 160.

Figure 4:
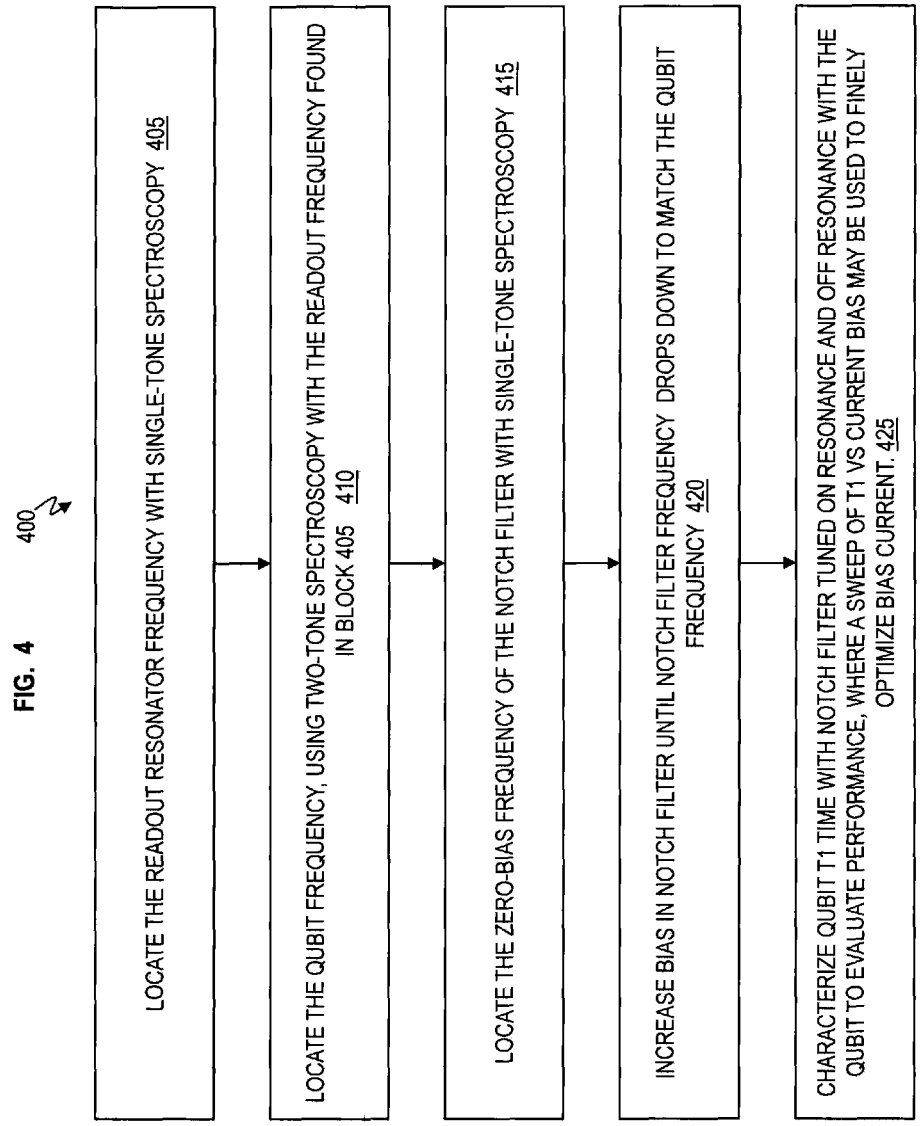
FIG. 4 illustrates a flow chart of utilizing the superconducting tunable notch filter to increase/improve the coherence time ($T_1$ time) in the excited state according to an embodiment.

FIG. 4 illustrates a flow chart 400 of utilizing the tunable notch filter 110 to increase the time (i.e., improve $T_1$ time) in the excited state according to an embodiment.

At block 405, the control and network equipment 180 is utilized to locate the readout resonator frequency (of the readout resonator 160) with single-tone spectroscopy. For example, a microwave signal is sent from $Z_{env}$ (by the control and network equipment 180) to the device under test (i.e., the readout resonator 160 in the transmon qubit circuit 120). The phase of the reflected signal (i.e., reflected back to the control and network equipment 180) is monitored while the frequency is swept. As the frequency is swept across the readout resonator 160, a 360° (degree) phase shift will occur, denoting the location in frequency of the readout resonator 160. Note that a radio frequency sweep, frequency sweep, or RF sweep refers to scanning a radio frequency band for detecting signals being transmitted thereon. This is implemented using a radio receiver having a tunable receiving frequency. As the frequency of the receiver is changed to scan (sweep) a desired frequency band, a display indicates the power of the signals received at each frequency.

At block 410, the control and measurement equipment 180 is configured to locate the qubit frequency of the qubit 150, using two-tone spectroscopy with the readout resonator frequency (of the readout resonator 160) found in block 405.

For example, a probe pulse (generated by the probe device 185, which includes a signal generator to generate pulses) is sent to the qubit drive port/drive line. As the frequency of the probe pulse is swept (i.e., generated across a band of frequencies) by the probe pulse device 185, the phase of a microwave signal reflected off the readout resonator 160 is monitored and measured at $Z_{env}$ 130 by the control and measurement equipment 180. In one case, this is measured by down converting the reflected signal via a data acquisition card. When the probe pulse frequency (sent by the probe pulse device 185) matches the qubit frequency of the qubit 150, the qubit 150 transitions to the excited state. This results in the readout pulse (of the readout resonator 160) reflecting (to the control and network equipment 180) with a shifted phase, indicating that the qubit 150 has been excited.

At block 415, the control and network equipment 180 is utilized to locate the zero-bias frequency (i.e., no DC bias current ($I_{bias}$) applied) of the notch filter 110 with single-tone spectroscopy. The same measurement as performed in block 405 (for the resonator frequency) is executed, but this time the frequency is swept (via the control and network equipment 180) around the frequency region/band that the notch filter 110 is expected to be located. For example, a microwave signal is sent from $Z_{env}$ (by the control and network equipment 180) to the device under test (i.e., the notch filter 110). The phase of the reflected signal (i.e., reflected back to the control and network equipment 180) is monitored while the frequency is swept. As the frequency is swept across the expected frequencies, a 360° (degree) phase shift will occur (as measured by the control and network equipment 180), denoting the notch filter frequency of the notch filter 110.

Once the notch filter frequency of the notch filter 110 is determined (with no DC bias current applied), the DC bias current ($I_{bias}$) in the notch filter 110 is (incrementally) increased until the notch filter frequency drops down to match the qubit frequency of the superconducting qubit 150 at block 420. For example, a DC bias current (by the current source 45) is applied to the notch filter 110, and its change in notch filter frequency is measured at a particular bias point by repeating the measurement of block 415 (noting that the highest possible frequency was found in block 415 with zero bias current).

At block 425, the control and network equipment 180 is utilized to characterize qubit $T_1$ time with the notch filter frequency of the notch filter 110 tuned on resonance with the qubit frequency and off resonance with the qubit frequency to evaluate performance of the notch filter 110. A sweep of $T_1$ versus current bias ($I_{bias}$) may be used to finely optimize bias current, such that the $T_1$ time is at a maximum (before the qubit 150 loses energy). For example, a measurement of the qubit's energy relaxation time (T1) is performed with bias current applied (via control and network equipment 180) until the bias current causes the notch filter frequency to match the qubit frequency. $T_1$ is measured again with the notch filter detuned (i.e., matching the qubit frequency), allowing the improvement in $T_1$ to be observed.

Note that $T_1$ is determined by exciting the qubit 150 (apply a pi ($\pi$) pulse at the qubit frequency on the drive port by the probe device 185), waiting a period of time, then applying a pulse at the readout frequency (via the control and network equipment 180), and measuring the phase of the reflected signal (at $Z_{env}$ 130 by the control and measurement equipment 180 (e.g., via the data acquisition card). After many repeated measurements at several different wait times (e.g., increasing intervals of wait times), an exponentially decaying trend is observed for probability of the qubit 150 being in the excited state versus time elapsed since the qubit was prepared in the excited state (application of $\pi$ pulse by the probe device 185). The decay constant of this exponential decay is $T_1$.

Figure 13:
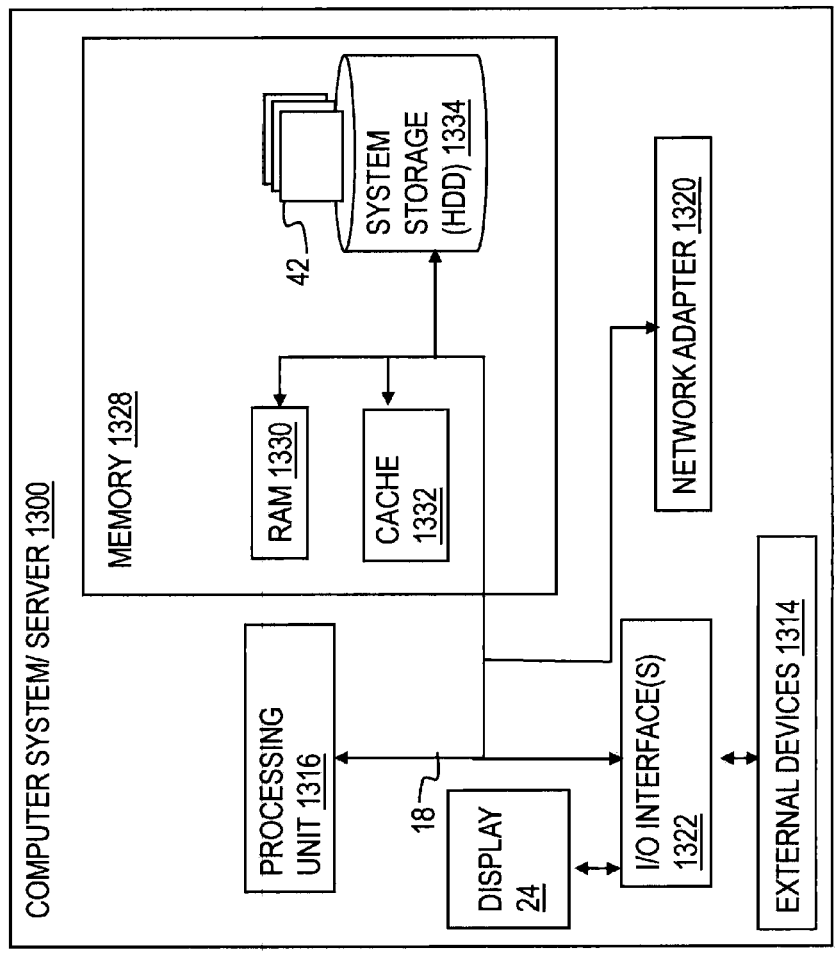
FIG. 13 illustrates a schematic of a computer system configured to implement, control, and/or operate elements herein according to an embodiment.

The control and network equipment 180, the probe device 185, and/or the current source 45 may be implemented in and/or controlled by a computer 1300 in FIG. 13. Therefore, the computer 1300 may be configured to send a pulse to place the qubit 150 into the excited state. The computer 1300 may be configured to tune the notch filter frequency on resonance as the qubit frequency, by increasing and decreasing the magnitude of the current bias ($I_{bias}$). Further details of the computer 1300 are discussed herein.

FIGS. 5 through 11 illustrate various examples of using the tunable notch filter 110 according to embodiments. Some details of the transmon qubit 120, line 140, and superconducting tunable notch filter 110 in FIGS. 1 and 3 may be omitted but are understood to be present. Also, reference can be made to FIGS. 1-4 and 13.

Figure 5:
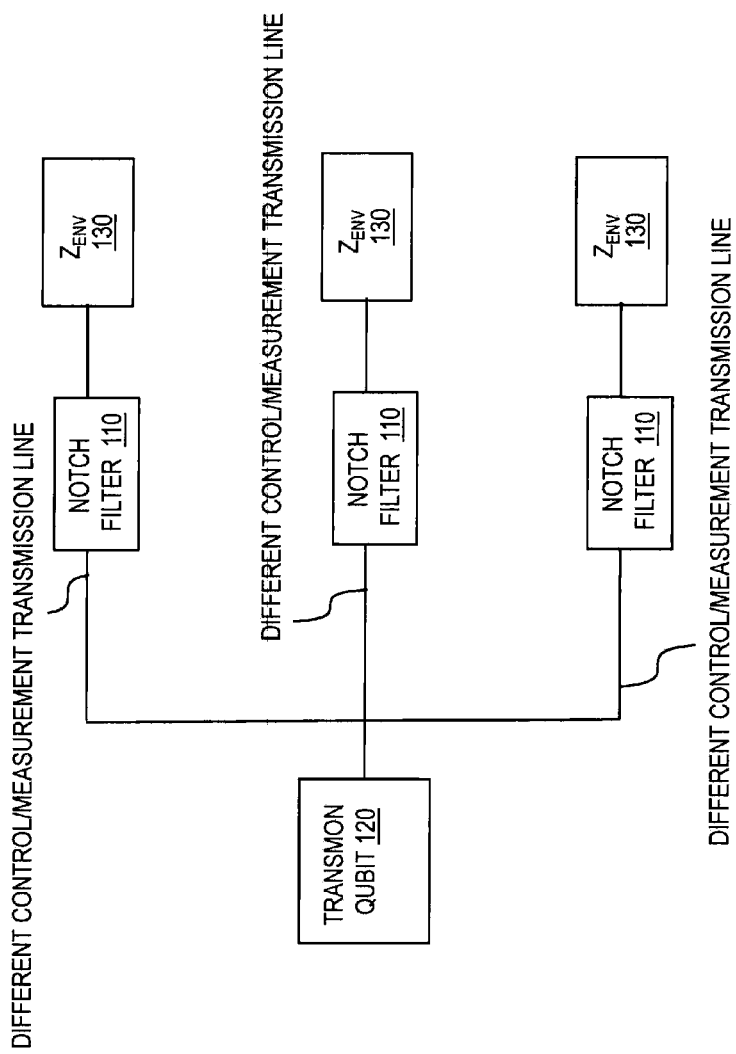
FIG. 5 illustrates a block diagram of utilizing multiple superconducting tunable notch filters with more than a single control and measurement line according to an embodiment.

FIG. 5 illustrates a block diagram of utilizing multiple tunable notch filters 110 with more than a single control and measurement line according to an embodiment. This allows the use of multiple Z environments ($Z_{env}$ 130) each with its own respective notch filter 110. Each Z environment is connected to its own transmission and measurement line.

Figure 6:
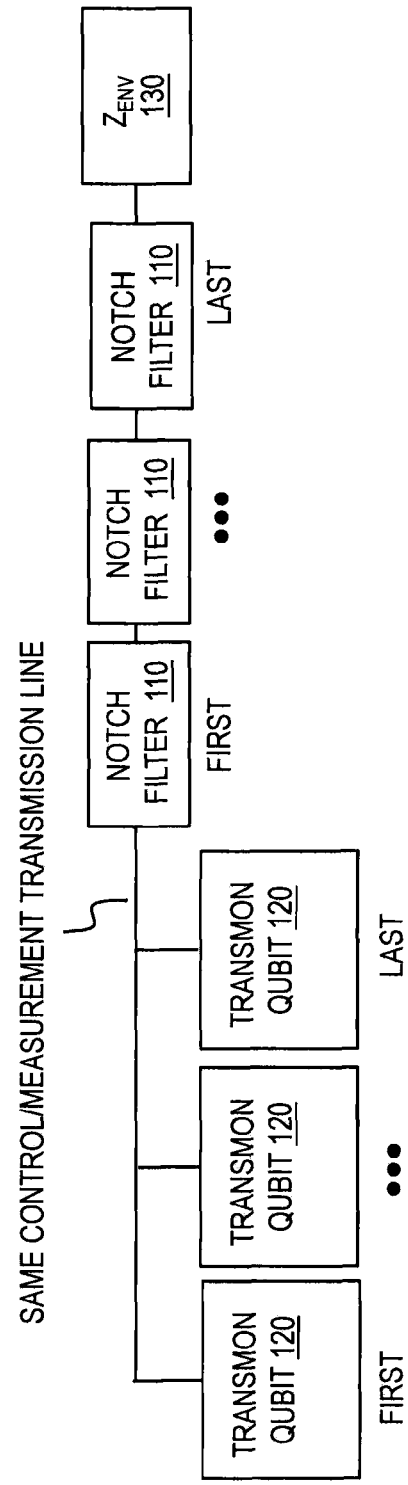
FIG. 6 illustrates a block diagram of utilizing multiple superconducting tunable notch filters on a single line to protect multiple superconducting qubits according to an embodiment.

FIG. 6 illustrates a block diagram of utilizing multiple notch filters 110 on a single line to protect multiple transmon qubits 120 according to an embodiment. In this case, each transmon qubit 120 has its own respective notch filter 110 in a one-to-one relationship, such that a first notch filter 110 has its notch filter frequency tuned to the qubit frequency of a first transmon qubit 120 (i.e., the qubit 150), a second notch filter 110 has it notch filter frequency tuned to the qubit frequency of the second transmon qubit 120, through a last notch filter 110 that has its notch filter frequency tuned to the qubit frequency of the last transmon qubit 120.

Figure 7:
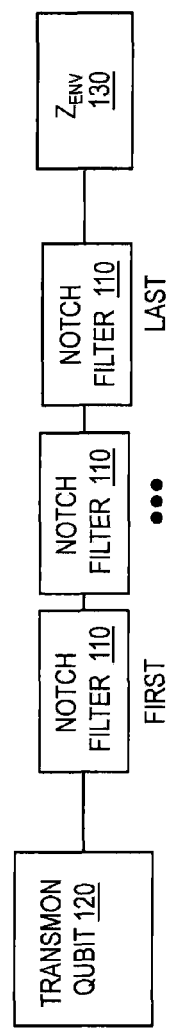
FIG. 7 illustrates a block diagram of utilizing superconducting tunable multiple notch filters to extend notch bandwidth according to an embodiment.

FIG. 7 illustrates a block diagram of utilizing multiple notch filters to extend notch bandwidth according to an embodiment. In this case, a first through a last notch filter 110 is added between the transmon qubit 120 and the $Z_{env}$ 130. Each of the notch filters 110 may be tuned to nearly the same notch filter frequency to increase the bandwidth of the notch filters 110 as a whole. The increased bandwidth provides multiple sharp resonances which are placed next to each other to form one broad feature. Accordingly, tuning the multiple notch filters 110 to nearly the same notch filter frequency results in a multi-pole filter.

Figure 8:
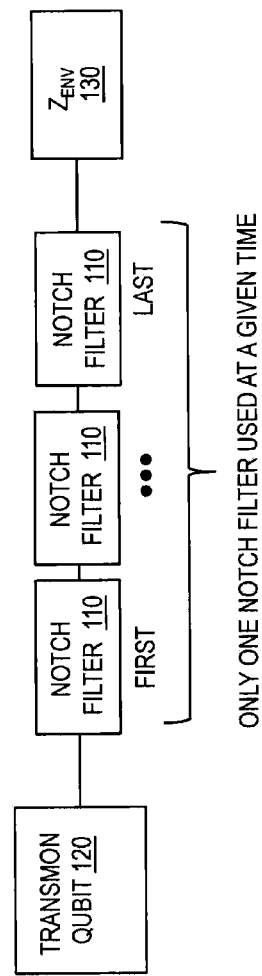
FIG. 8 illustrates a block diagram of utilizing multiple superconducting tunable notch filters to extend the tunable range of the notch filters according to an embodiment.

FIG. 8 illustrates a block diagram of utilizing multiple notch filters 110 to extend the tunable range of the notch filters 110 according to an embodiment. The tunable range of an individual notch filter 110 is the range/spectrum in which the notch filter frequency can be moved (adjusted) down from its highest notch filter frequency to its lowest notch filter frequency. In FIG. 8, the first notch filter 110 may have a tunable notch filter frequency range from 5.000 to 5.005, the second notch filter 110 may have a tunable notch filter frequency range from 5.004 to 5.009, the third notch filter 110 may have a tunable notch filter frequency range from 5.008 to 5.013 GHz, the fourth notch filter 110 may have a tunable notch filter frequency range of 5.012 to 5.017 GHz, and so forth. Each of the first through the last notch filters 110 may be constructed to have a slightly different tunable notch filter frequency range (e.g., with a small overlap). In FIG. 8, only one notch filter 110 may be utilized at a given time to reflect the qubit frequency back to the transmon qubit 120 (particularly back to the qubit 150).

Figure 9:
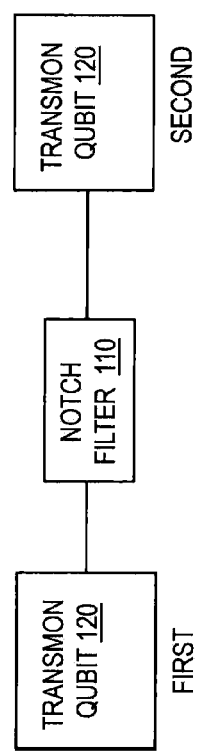
FIG. 9 illustrates a block diagram of utilizing the superconducting tunable notch filter for tunable coupling between superconducting qubits according to an embodiment.

FIG. 9 illustrates a block diagram of utilizing the notch filter 110 for tunable coupling between transmon qubits 120 according to an embodiment. The notch filter 110 is positioned between a first transmon qubit 120 and a second transmon qubit 120, where the first and second transmon qubits 120 are at the same qubit frequency. When the notch filter 110 is off resonance, which means that the notch filter frequency is not tuned to the qubit frequency of the first and second transmon qubits 120, the first transmon qubit 120 can couple to the second transmon qubit 120 (and vice versa). When the notch filter frequency of the notch filter 110 is on resonance, which means that the notch filter frequency is tuned to the qubit frequency of the first and second transmon qubits 120, the first transmon qubit 120 cannot couple with the second transmon qubit 120 (and vice versa). The coupling strength can be varied from strong to weak.

Figure 10:
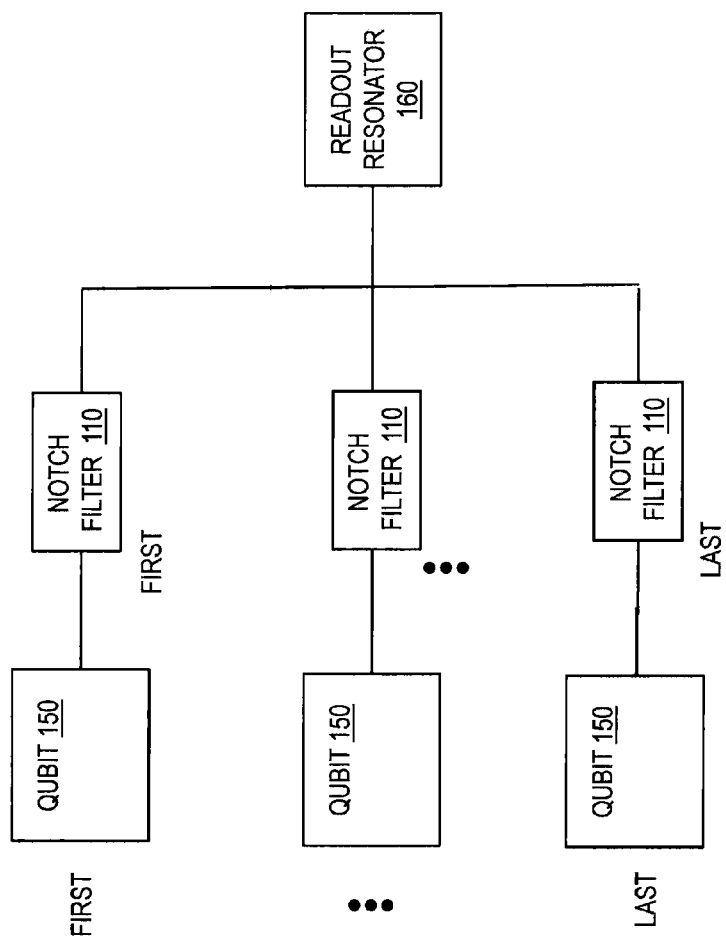
FIG. 10 illustrates a block diagram of utilizing superconducting tunable notch filters for selective coupling between multiple qubits and a single readout resonator according to an embodiment.

FIG. 10 illustrates a block diagram of utilizing notch filters for selective coupling between multiple qubits 150 and a single readout resonator 160 according to an embodiment. FIG. 10 has first through last qubits 150 corresponding to first through last notch filters 110 on a one-to-one basis. For one of the first through last qubits 150 to couple to the single readout resonator 160, the respective notch filter 110 (between the readout resonator 160) has to be tuned off resonance. For example, for the first qubit 150 to couple with the readout resonator 160, the first notch filter 110 has to have its notch filter frequency tuned off resonance with the qubit frequency of the first qubit 150. The same process is required for each of the qubits 150 to couple with the single readout resonator 160.

Figure 11:
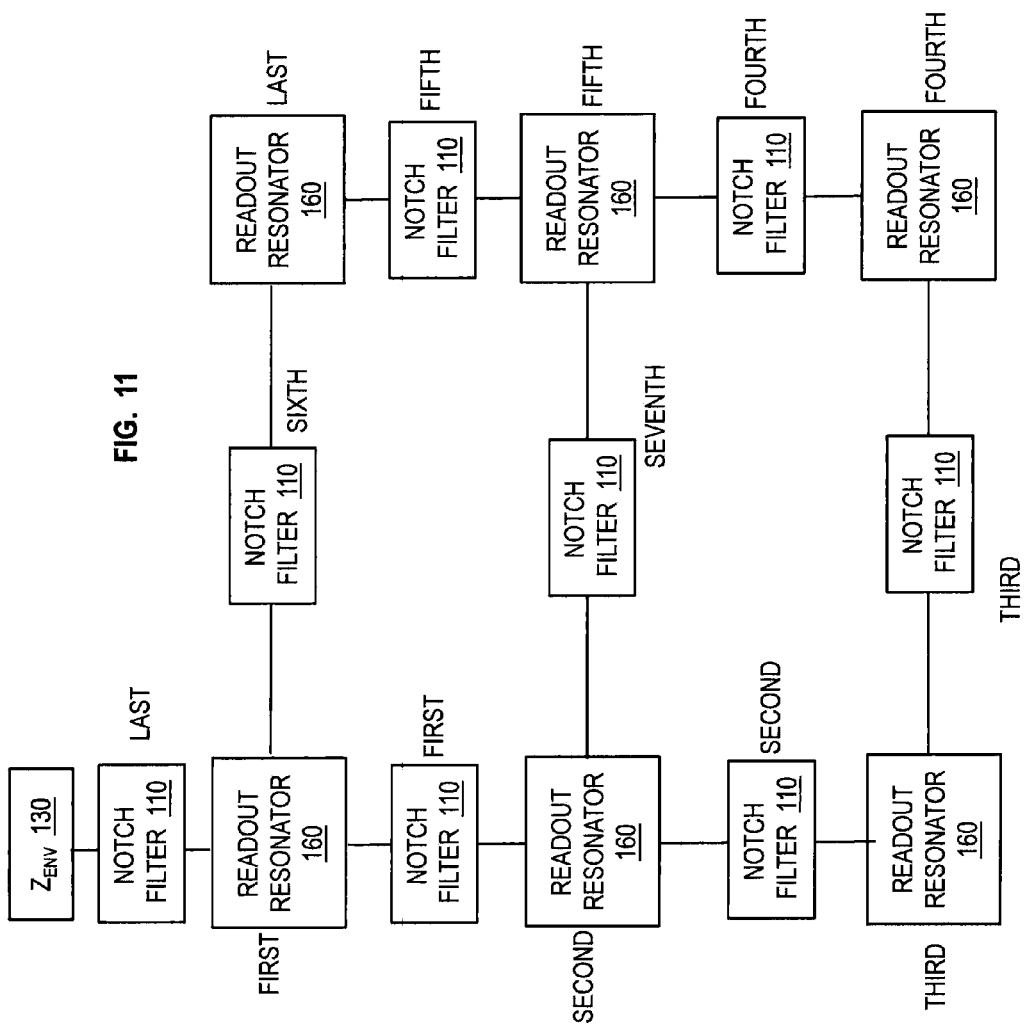
FIG. 11 illustrates a block diagram of utilizing superconducting tunable notch filters to route photons through a grid of readout resonators by selectively coupling readout resonators according to an embodiment.

FIG. 11 illustrates a block diagram of utilizing notch filters to route photons through a grid of readout resonators by selectively coupling readout resonators according to an embodiment. FIG. 11 has a first through last readout resonator 160 and a first through last notch filter 110. In the grid of readout resonators 160, each readout resonator 160 has one notch filter 110 connected in between another readout resonator 160. Having the notch filter 110 connected in between any two readout resonators 160 allows the notch filter 110 connected in between to selective couple the two readout resonators 160 together and/or block the two readout resonators 160 from being coupled together. Having every two (nearby) readout resonators 160 connected by a notch filter 110 allows the notch filter 110 to shuffle a photon throughout the grid by switching from off resonance to on resonance. Assume that the readout frequency is the same for each of the first through last readout resonators 160 and the first through last notch filters 110 can each tune the readout frequency by applying a DC bias current ($I_{bias}$). Assume that the control and measurement equipment 180 (e.g., a signal source) at $Z_{env}$ 130 sends a signal to the first readout resonator 160 in order to excite a photon (and/or a quantum of light or energy) in the first readout resonator 160 (when the last notch filter 110 is off resonance), and the last notch filter 110 blocks the photon from being reflected back to the $Z_{env}$ 130 by being tuned to on resonance with the readout frequency of the first readout resonator 160. Assume that all first through last notch filters 110 remain on resonance (i.e., are not tuned to the readout frequency) until tuned to on resonance (e.g., by the computer 1300 causing the $I_{bias}$ to be applied). To selectively couple the first readout resonator 160 to the second readout resonator 160, the first notch filter 110 is tuned off resonance which allows the photon to travel from the first readout resonator 160 to the second readout resonator 160, and then the first notch filter 110 is again tuned on resonance with the readout frequency. Note that in FIG. 11 the first through last notch filters 110 act like switches that can be opened (e.g., off resonance) to allow the photon to travel and closed (e.g., on resonance) to trap the photon at a particular readout resonator 160. Now continuing the example, the second notch filter 110 can be opened (by tuning off resonance) in order to allow the photon to travel from the second readout resonator 160 to the third readout resonator 160, and then the second notch filter 110 can be closed thus trapping the photon at the third readout resonator 160. Optionally, the seventh notch filter 110 could have been opened to allow the photon to travel from the second readout resonator 160 to the fifth readout resonator 160.

Assuming that the photon is at the third readout resonator 160 in FIG. 11, the third notch filter 110 can be opened to allow the photon to travel from the third readout resonator 160 to the fourth readout resonator 160, and the third notch filter 110 is closed to trap the photon at the fourth readout resonator 160. This process of opening and closing the notch filter coupling two readout resonators can continue until the photon is back at the first readout resonator 160. At which case, the last notch filter 110 can be opened (i.e., tuned off resonance) to allow the photon to travel to the $Z_{env}$ 130.

Figure 12:
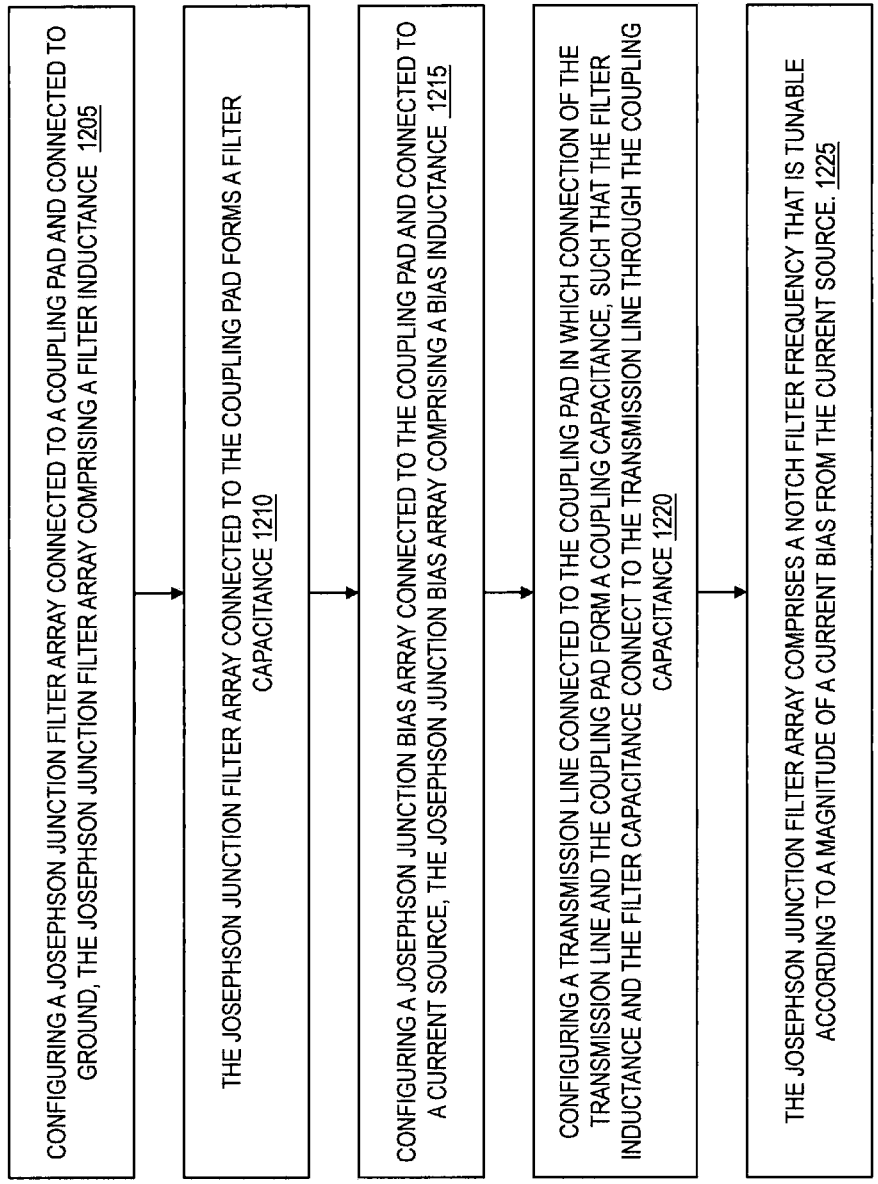
FIG. 12 is a flow chart illustrating a method for providing a superconductor tunable notch filter according to an embodiment.

Now referring to FIG. 12, FIG. 12 is a flow chart 1200 illustrating a method for providing a superconductor tunable notch filter according to an embodiment. Reference can be made to FIGS. 1-11 and 13.

At block 1205, the Josephson junction filter array 10 is connected to a coupling pad 310 and connected to ground, and the Josephson junction filter array 10 comprises a filter inductance $L_f$. The coupling pad 310 is electrically connected to the CPW/line 170 in order to connect to, e.g., the transmon qubit 120 and $Z_{env}$ 130 (on line 140).

At block 1210, the Josephson junction filter array 10 connected to the coupling pad 310 forms a filter capacitance $C_f$.

At block 1215, the Josephson junction bias array 40 is connected to the coupling pad 310 and connected to the current source 45, and the Josephson junction bias array 40 comprises the bias inductance $L_{bias}$.

At block 1220, the transmission line 170 is connected to the coupling pad 310 in which the connection of the transmission line 170 and the coupling pad 310 form the coupling capacitance $C_c$, such that the filter inductance $L_f$ and the filter capacitance $C_f$ connect to the transmission line 170 through the coupling capacitance $C_c$.

At block 1225, the Josephson junction filter array 10 comprises a notch filter frequency that is tunable according to a magnitude of the DC current bias ($I_{bias}$) from the current source 45.

The notch filter frequency at zero bias current is designed based on values for the filter inductance $L_f$, the filter capacitance $C_f$, the bias inductance $L_{bias}$, and the coupling capacitance $C_c$. The notch filter frequency at zero bias current is roughly given by $f=1/(2\pi sqrt(L_f(C_f+C_c)))$.

The notch filter 110 is designed such that increasing the magnitude of the current bias ($I_{bias}$) decreases the notch filter frequency, thus allowing the notch filter 110 to be tuned. The notch filter 110 is configured such that the notch filter frequency has different tuning ranges according to the values selected for the filter inductance $L_f$, the filter capacitance $C_f$, the bias inductance $L_{bias}$, and the coupling capacitance $C_c$. The tuning range (of the notch filter 110) is a range of frequencies in which the notch filter frequency can vary by changing the current bias. For example, if the zero bias current notch filter frequency is 6 GHz and the notch filter frequency can be tuned down to 5.5 GHz, then the tuning range is from 5.5 to 6.0 GHz (which is a span of 500 MHz).

The notch filter 110 is connected between the transmon qubit circuit 120 and the transmission Z environment ($Z_{env}$ 130 on transmission and measurement line 140). The transmon qubit circuit 120 comprises the qubit 150 and the readout resonator 160. The transmission environment (on transmission line 140) comprises an environment impedance (encompassed by $Z_{env}$ 130) which is typically 50 ohms. The environment impedance, represented by Zenv 130, takes into account the impedance of the control and measurement equipment 180. The notch filter 110 affects the qubit frequency only and does not affect readout of the readout resonator 160.

The notch filter frequency of the notch filter 110 is tuned to a qubit frequency of the transmon qubit circuit 120 (particularly qubit 150) by increasing the magnitude of the current bias until the notch filter frequency matches the qubit frequency.

A plurality of notch filters 110 are provided (individually) between the transmon qubit circuit 120 and a plurality of transmission Z environments ($Z_{env}$ 130), where each of the plurality of transmission environments have a different transmission line. Reference can be made to FIG. 5.

A plurality of notch filters 110 are provided between a plurality of transmon qubit circuits 120 and a (single) transmission Z environment ($Z_{env}$ 130). Reference can be made to FIG. 6.

A plurality of notch filters 110 are provided between a transmon qubit circuit 120 and a transmission Z environment, where each of the plurality of notch filters 110 are tuned to a notch filter frequency within a predefined range. Reference can be made to FIG. 7.

A plurality of notch filters 110 between a transmon qubit circuit 120 and a transmission Z environment, where each of the plurality of notch filters 110 are tuned to a different notch filter frequency. Reference can be made to FIG. 8.

The notch filter 110 is provided between a first transmon qubit circuit 120 and a second transmon qubit circuit 120, where the first transmon qubit circuit 120 and the second transmon qubit circuit 120 have a same qubit frequency. Tuning the notch filter frequency of the notch filter 110 to the same qubit frequency (of the first and second transmon qubit circuits 120) blocks communication between the first transmon and second transmon qubit circuits 120. Conversely, tuning the notch filter frequency of the notch filter 110 to be different (i.e., off resonance) from the same qubit frequency (of the first and second transmon qubit circuits 120) allows communication between the first and second transmon qubit circuits 120. Reference can be made to FIG. 9.

A plurality of qubits 150 are connected to a (single) readout resonator 160, where each of the plurality of qubits 150 are connected to the readout resonator 160 by respective notch filters 110 (i.e., one notch filter connected in between each qubit 150 and the readout resonator 160). One of the plurality of qubits 150 is selectively coupled to the readout resonator 160 by tuning a notch filter frequency of a corresponding one of the respective notch filters 110 off resonance (where the corresponding notch filter is positioned between particular qubit 150 being turned on). Reference can be made to FIG. 10.

A grid of readout resonators 160 are individually connected to one another by corresponding notch filters 110. Any two readout resonators 160 are selectively coupled together by tuning a corresponding notch filter 110, connected in between the any two readout resonators 160, off resonance. Reference can be made to FIG. 11.

The notch filter 110 is tuned to a notch filter frequency that matches a qubit frequency of the qubit transmon circuit 120 such that the notch filter frequency (of the notch filter 110) reflects the (energy/photons at the) qubit frequency back to the qubit transmon circuit 120. Reflecting the qubit frequency back (i.e., reflecting the energy/photons at the qubit frequency) to the qubit transmon circuit 120 causes the qubit transmon circuit 120 (particularly the qubit 150) to remain in an excited state longer than if the qubit frequency is not reflected.

Referring now to FIG. 13, a schematic of an example computer system/server 1300 (computer) that may implement, connect to, and/or control elements discussed herein. Examples of well-known computing systems, environments, and/or configurations that may be suitable for use with computer system 1300 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 1300 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1300 may be practiced in distributed cloud computing environments where tasks are performed by remote processing devices that are linked through a communications network. In a distributed cloud computing environment, program modules may be located in both local and remote computer system storage media including memory storage devices.

The components of computer system/server 1300 may include, but are not limited to, one or more processors or processing units 1316, a system memory 1328, and a bus 1318 that couples various system components including system memory 1328 to processor 1316. The processor units 1316 include processing circuitry to read, process, and execute computer executable instructions as understood by one skilled in the art.

Bus 1318 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 1300 typically includes a variety of computer system readable media. Such media may be any available media that is accessible by computer system/server 1300, and it includes both volatile and non-volatile media, removable and non-removable media. System memory 1328 can include computer system readable media in the form of volatile memory, such as random access memory (RAM) 1330 and/or cache memory 1332. Computer system/server 1300 may further include other removable/non-removable, volatile/non-volatile computer system storage media. By way of example only, storage system 1334 can be provided for reading from and writing to a non-removable, non-volatile magnetic media (not shown and typically called a "hard drive", "hard disk", and/or "hard disk drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1318 by one or more data media interfaces. As will be further depicted and described below, memory 1328 may include at least one program product having a set (e.g., at least one) of program modules that are configured to carry out the functions of embodiments of the invention.

The memory 1328 by way of example, and not limitation, may include an operating system, one or more application programs, other program modules, and program data shown as program modules 42. The operating system, one or more application programs, other program modules, and program data (or some combination thereof) may include an implementation of a networking environment. The program modules 42 (which may be one or more software applications) are configured to carry out the functions and/or methodologies of embodiments as described herein Computer system/server 1300 may also couple with one or more external devices 1314 such as a keyboard, a pointing device, a display 1324, etc.; one or more devices that enable a user to interact with computer system/server 1300; and/or any devices (e.g., network card, modem, etc.) that enable computer system/server 1300 to communicate with one or more other computing devices. Such communication can occur via Input/Output (I/O) interfaces 1322. Still yet, computer system/server 1300 can communicate with one or more networks such as a local area network (LAN), a general wide area network (WAN), and/or a public network (e.g., the Internet) via network adapter 1320. As depicted, network adapter 1320 communicates with the other components of computer system/server 1300 via bus 1318. It should be understood that although not shown, other hardware and/or software components could be used in conjunction with computer system/server 1300. Examples, include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), astatic random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A superconductor tunable notch filter comprising:
a Josephson junction filter array connected to a coupling pad and connected to ground, the Josephson junction filter array comprising a filter inductance;
wherein the Josephson junction filter array connected to the coupling pad forms a filter capacitance;
a Josephson junction bias array connected to the coupling pad and connected to a current source, the Josephson junction bias array comprising a bias inductance; and
a transmission line connected to the coupling pad in which connection of the transmission line and the coupling pad form a coupling capacitance, such that the filter inductance and the filter capacitance connect to the transmission line through the coupling capacitance;
wherein the Josephson junction filter array comprises a notch filter frequency that is tunable according to a magnitude of a current bias from the current source.

2. The filter of claim 1, wherein the notch filter frequency at zero bias current is designed based on values for the filter inductance, the filter capacitance, the bias inductance, and the coupling capacitance.

3. The filter of claim 1, wherein the notch filter is designed such that increasing the magnitude of the current bias decreases the notch filter frequency, thus allowing the notch filter to be tuned.

4. The filter of claim 2, wherein the notch filter is configured such that the notch filter frequency has different tuning ranges according to the values selected for the filter inductance, the filter capacitance, the bias inductance, and the coupling capacitance;
wherein a tuning range is a range of frequencies in which the notch filter frequency can vary by changing the current bias.

5. A method for providing a superconductor tunable notch filter, the method comprising:
configuring a Josephson junction filter array connected to a coupling pad and connected to ground, the Josephson junction filter array comprising a filter inductance ($L_f$);
wherein the Josephson junction filter array connected to the coupling pad forms a filter capacitance ($C_f$);
configuring a Josephson junction bias array connected to the coupling pad and connected to a current source, the Josephson junction bias array comprising a bias inductance ($L_{bias}$);
configuring a transmission line connected to the coupling pad in which connection of the transmission line and the coupling pad form a coupling capacitance, such that the filter inductance and the filter capacitance connect to the transmission line through the coupling capacitance;
wherein the Josephson junction filter array comprises a notch filter frequency that is tunable according to a magnitude of a current bias from the current source.

6. The method of claim 5, wherein the notch filter frequency at zero bias current is designed based on values for the filter inductance, the filter capacitance, the bias inductance, and the coupling capacitance.

7. The method of claim 5, wherein the notch filter is designed such that increasing the magnitude of the current bias decreases the notch filter frequency, thus allowing the notch filter to be tuned.

8. The method of claim 6, wherein the notch filter is configured such that the notch filter frequency has different tuning ranges according to the values selected for the filter inductance, the filter capacitance, the bias inductance, and the coupling capacitance;
wherein a tuning range is a range of frequencies in which the notch filter frequency can vary by changing the current bias.

9. The method of claim 5, further comprising connecting the notch filter between a superconducting qubit circuit and a transmission environment.

10. The method of claim 9, wherein the superconducting qubit circuit comprises a qubit and a readout resonator;
wherein the readout resonator is coupled to an environmental impedance.

11. The method of claim 9, furthering comprising tuning the notch filter frequency to a qubit frequency of the superconducting qubit circuit by increasing the magnitude of the current bias until the notch filter frequency matches the qubit frequency;
wherein the notch filter affects the qubit frequency only and does not affect readout of the readout resonator.

12. The method of claim 5, further comprising providing a plurality of notch filters between a superconducting qubit circuit and a plurality of transmission environments, each of the plurality of transmission environments having a different transmission line.

13. The method of claim 5, further comprising providing a plurality of notch filters between a plurality of superconducting qubit circuits and a transmission environment.

14. The method of claim 5, further comprising providing a plurality of notch filters between a superconducting qubit circuit and a transmission environment, wherein each of the plurality of notch filters are tuned to the notch filter frequency within a predefined range.

15. The method of claim 5, further comprising providing a plurality of notch filters between a superconducting qubit circuit and a transmission environment, wherein each of the plurality of notch filters are tuned to a different notch filter frequency.

16. The method of claim 5, further comprising providing the notch filter between a first superconducting qubit circuit and a second superconducting qubit circuit, the first superconducting qubit circuit and the second superconducting qubit circuit having the same qubit frequency;
wherein tuning the notch filter frequency of the notch filter to the same qubit frequency blocks communication between the first superconducting qubit circuit and the second superconducting qubit circuit;
wherein tuning the notch filter frequency of the notch filter to be different from the same qubit frequency allows communication between the first superconducting qubit circuit and the second superconducting qubit circuit.

17. The method of claim 5, further comprising providing a plurality of qubits connected to a readout resonator, each of the plurality of qubits connected to the readout resonator by respective notch filters;
selectively coupling one of the plurality of qubits to the readout resonator by tuning the notch filter frequency of a corresponding one of the respective notch filters off resonance.

18. The method of claim 5, further comprising providing a grid of readout resonators individually connected to one another by corresponding notch filters;

selectively coupling any two readout resonators together by tuning a corresponding one of the corresponding notch filters, connected in between the any two readout resonators, off resonance.

19. The method of claim 9, wherein the notch filter is tuned to the notch filter frequency that matches a qubit frequency of the superconducting qubit circuit such that the notch filter reflects the qubit frequency back to the superconducting qubit circuit.

20. The method of claim 19, wherein reflecting the qubit frequency back to the superconducting qubit circuit causes the superconducting qubit circuit to remain in an excited state longer than if the qubit frequency is not reflected.

\* \* \* \* \*